United States Patent [19]
Bortolini et al.

[11] Patent Number: 5,392,005
[45] Date of Patent: Feb. 21, 1995

[54] FIELD CALIBRATION OF A DIGITALLY COMPENSATED CRYSTAL OSCILLATOR OVER A TEMPERATURE RANGE

[75] Inventors: James R. Bortolini, Boulder; Gary J. Grimes, Thornton, both of Colo.

[73] Assignee: AT&T Corp., Murray Hill, N.J.

[21] Appl. No.: 129,539

[22] Filed: Sep. 30, 1993

[51] Int. Cl.[6] .............................. H03L 1/00
[52] U.S. Cl. ...................... 331/44; 331/158; 331/176
[58] Field of Search .................. 331/158, 176, 116 R, 331/44

[56] References Cited
U.S. PATENT DOCUMENTS

| | | | |
|---|---|---|---|
| 4,746,879 | 5/1988 | Ma et al. | 331/44 |
| 4,922,212 | 5/1990 | Roberts et al. | 331/176 |
| 4,930,142 | 5/1990 | Whiting et al. | 375/120 |
| 5,041,798 | 8/1991 | Moorman et al. | 331/1 A |

Primary Examiner—Siegfried H. Grimm
Attorney, Agent, or Firm—John C. Moran

[57] ABSTRACT

Solving the aging problem of crystal oscillators by doing field recalibration. The solution is to utilize an accurate external reference signal to determine when the frequency of the digital temperature compensated crystal oscillator (DTCXO) has drifted from the reference signal in excess of a specification. When this occurs, the DTCXO has used its internal compensation values to correct its output hence the difference between the external reference signal and the frequency of the DTCXO in excess of the specification is due to aging. A new compensation value for the present temperature is calculated using the reference signal. Using the well known fact that the temperature aging uniformly shifts the frequency over the temperature range, a controller utilizes the difference between the new compensation value and the stored compensation value for the present temperature to shift the entire set of compensation values to compensate for the aging effect.

8 Claims, 4 Drawing Sheets

FIELD CALIBRATION OF A DIGITALLY COMPENSATED CRYSTAL OSCILLATOR OVER A TEMPERATURE RANGE

TECHNICAL FIELD

This invention relates to calibration of oscillators; and, in particular, to the field calibration of in-service oscillators over a temperature range.

BACKGROUND OF THE INVENTION

Within the prior art, there are two techniques that are utilized to compensate a crystal oscillator that is used in an environment whose temperature varies over a temperature range. One technique is to place the oscillator in an oven where the oven is maintained at a constant temperature; and the second technique is to use a digitally temperature compensated crystal oscillator (DTCXO). Both of these techniques suffer from the disadvantage that as a crystal oscillator is used its frequency shifts due to the mechanical aging of the crystal. This is referred to as crystal aging. A DTCXO uses a microcomputer to compensate a crystal oscillator over a range of temperatures to make the output frequency nominally constant over that temperature range. When the DTCXO is manufactured, the device is stepped through the range of temperatures one degree at a time and given time to thermally stabilize at each temperature. The output frequency is measured and compared against a reference frequency standard. If the frequency is not correct, a compensation value is adjusted by the microcomputer so that the output frequency of the DTCXO is within a given specification to the reference frequency. The digital representation of the compensation value is stored in a nonvolatile digital memory by the microcomputer. When the DTCXO is used in the field, as the temperature varies, the microcomputer uses a temperature sensor which is physically in contact with the crystal oscillator to determine the temperature and then access the compensation values to obtain the compensation value that corresponds to the present temperature. This compensation value is then used to adjust the DTCXO frequency so as to maintain that frequency within the specification. The problem with this technique is as the crystal ages, the stored compensation values are no longer accurate.

The first technique of placing the crystal oscillator in an oven suffers from the following additional problem. In many types of equipment, such as telecommunication switching equipment, the ambient temperature of the telecommunications systems is high so that the oven has to be maintained at an extremely high temperature which increases the aging process, increases the heat dissipated by the oscillator, and deceases the oscillator lifetime.

The prior an has overcome the problem of aging by simply operating crystal oscillators by themselves for many years until the aging effect has diminished. The problems with this technique is the high cost of such crystal oscillators and the fact that, while aging slows, it never stops.

SUMMARY OF THE INVENTION

This invention is directed to solving the aging problem of the prior art. The solution is to utilize an accurate external reference signal to determine when the frequency of the DTCXO has drifted from the reference signal in excess of a specification. When this occurs, the DTCXO has used its internal compensation values to correct its output hence the difference between the external reference signal and the frequency of the DTCXO in excess of the specification is due to aging. A new compensation value for the present temperature is calculated using the reference signal. Using the well known fact that the temperature aging uniformly shifts the frequency over the temperature range, a controller utilizes the difference between the new compensation value and the stored compensation value for the present temperature to shift the entire set of compensation values to compensate for the aging effect. Within a telecommunication switching system, a highly frequency accurate external reference signal is usually available from the telecommunication network.

DETAILED DESCRIPTION

Figure 1:
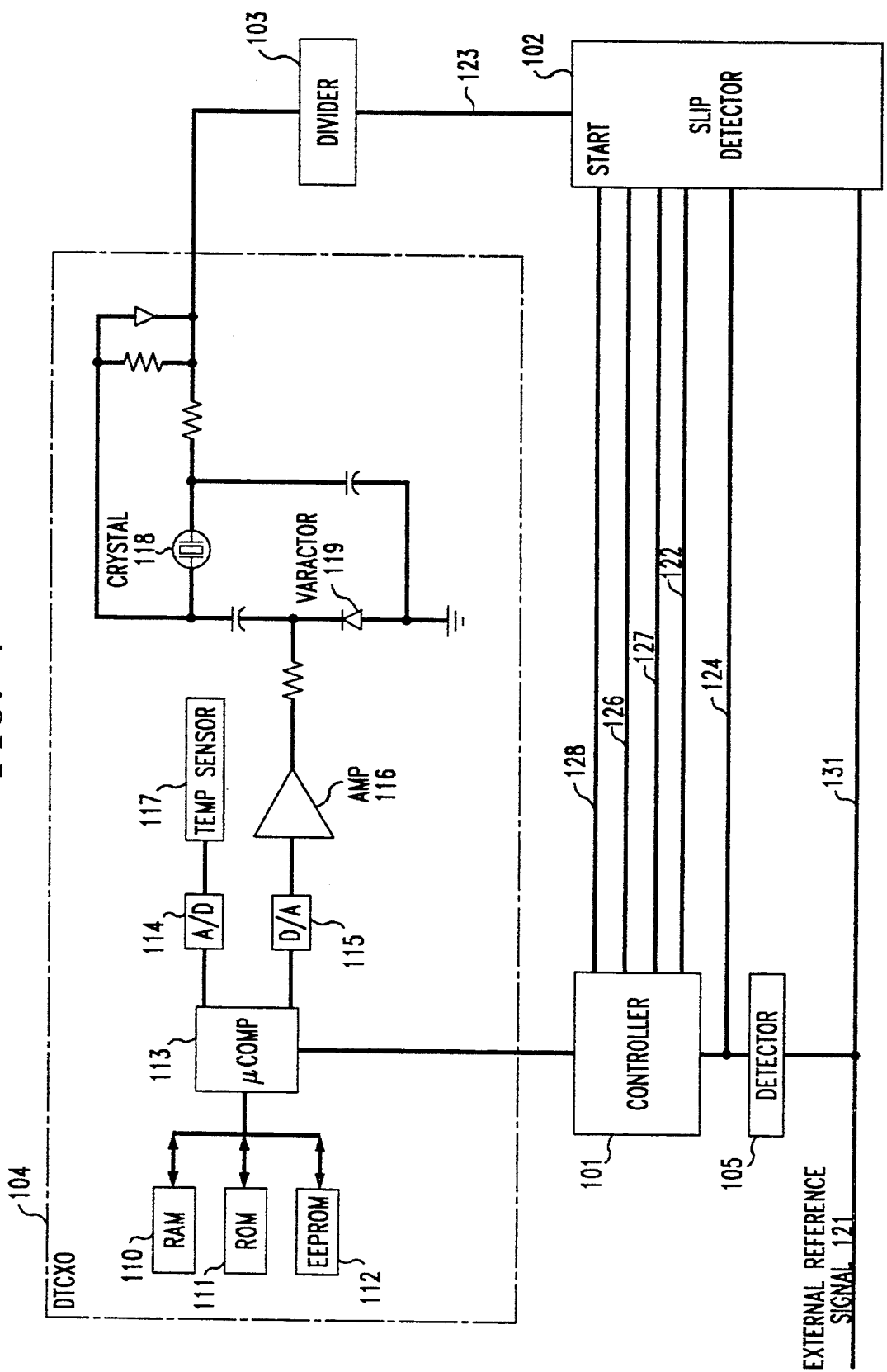
FIG. 1 illustrates, in block diagram form, a system utilizing the invention.

FIG. 1 illustrates a system in accordance with the invention. Controller 101 utilizes slip detector 102 to determine when the output of DTCXO 104, after being divided by divider 103 has departed by an integer number of clock cycles from external reference signal 121. In the normal operation of DTCXO 104, microcomputer 113 monitors the temperature of crystal 118 using temperature sensor 117 and analog-to-digital converter 114. Using the temperature measured by sensor 117 and converter 114, microcomputer 113 accesses EEPROM 112. Initially stored in EEPROM 112 are original compensation values as determined at the factory. Microcomputer 113 finds the compensation value corresponding to the measured temperature and transmits this compensation value to digital-to-analog converter 115. The latter converter converts the digital value to an analog signal which after being amplified by amplifier 116 controls the capacitance of varactor 119. The capacitance of varactor 119 controls the frequency at which crystal 118 oscillates. Over time, the correction provided by the original compensation values as illustrated as curve 201 of FIG. 2 no longer is capable of correcting the operation of crystal 118 to produce a frequency within the specification due to the aging of crystal 118. The change in crystal 118 is constant over a range of temperatures and can be corrected for by calculating new compensation values which are illustrated as corrected data curve 202 of FIG. 2. The curves of FIG. 2 apply to commonly used AT-cut crystals and are particularly advantageous because the frequency offset caused by aging is identical at all temperatures.

At periodic intervals, controller 101 communicates with microcomputer 113 to determine if the ambient temperature of crystal 118 has been stable for a sufficient period of time to allow recalibration. Advantageously, this period of time may be 1 to 2 hours. If the temperature has been stable, controller 101 starts slip detector 102 to determine the difference in frequency between the output of DTCXO 104 as divided by divider 103 and external reference signal 121. Illustratively, external reference signal 121 is operating at 64 kHz. If the system of FIG. 1 is used within a telecommunication network, external reference signal 121 has Stratum 1 accuracy and is received from the telecommunication network.

Figure 2:
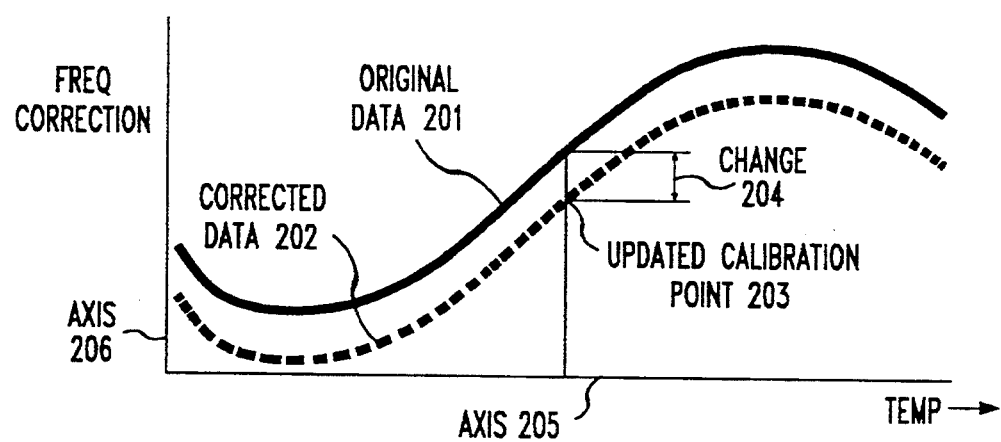
FIG. 2 illustrates the effect of aging over a temperature range.

If the operation of slip detector 102 finishes before a predefined time interval indicating that the output frequency of divider 103 exceeds the required minimum accuracy with respect to external reference signal 121, controller 101 requests from microcomputer 113 the data corresponding to the present temperature of crystal 118 stored in EEPROM 112 which is illustrated as update calibration point 203 in FIG. 2. Controller 101 then calculates the offset change that must be made to modify the data in EEPROM 112 to properly correct crystal 118 at the present temperature. This change is illustrated as change 204 in FIG. 2. Controller 101 then calculates corrected data curve 202 and transmits the new compensation values to microcomputer 113 which stores them in RAM 110. Microcomputer 113 always uses the compensation values stored in RAM 110 to control the voltage applied to varactor 119. The compensation values stored in EEPROM 112 are used to back up the compensation values in RAM 110. Microcomputer 113 then restarts detector 102 and repeats the above operations. If the output frequency of divider 103 is within the required minimum accuracy, controller 101 requests that microcomputer 113 transfer the compensation values from RAM 110 to EEPROM 112 and then, waits until it is time to perform a periodic recalibration.

Figure 3:
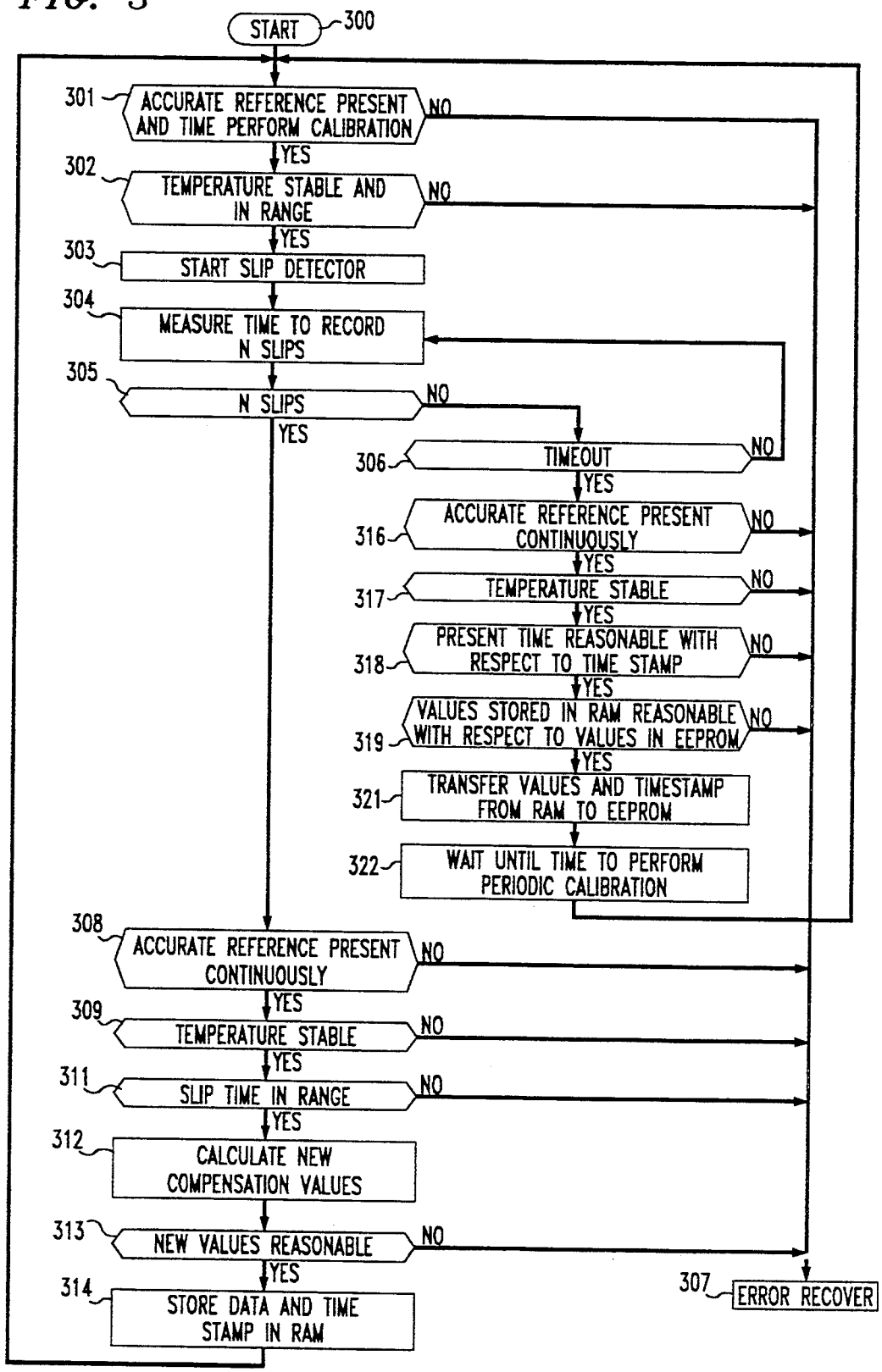
FIG. 3 illustrates the operations performed by the controller of FIG. 1.

FIG. 3 shows the operations performed by controller 101 during recalibration. These operations are started by execution of block 300 which transfers control to block 301. Decision block 301 determines whether external reference signal 121 is available by reading the output of detector 105. If the reference signal is present, decision block 302 is executed to determine if the temperature is stable and within a specified temperature range. The temperature measured is that of crystal 118 by temperature sensor 117. Controller 101 requests the temperature information from microcomputer 113. If the result of the decisions in either decision block 301 or 302 is no, control is transferred to block 307 which performs error recovery.

If the answer to decision block 302 is yes, control is transferred to block 303 which starts slip detector 102. Block 304 determines the time that blocks 304, 305, and 306 are executed as a repetitive loop. If N slips occur, then the time determined by block 304 represents that duration. Decision block 305 checks if N slips have occurred. If the answer is yes, control is transferred to block 308. If the answer is no, control is transferred to block 306 which determines if the maximum amount of time has been exceeded for N slips. If the answer to decision block 306 is yes, this means that the frequency of DTCXO 104 is within the minimum required accuracy of external reference signal 121 or an error has occurred. If the answer to decision block 306 is yes, control is transferred to blocks 316 through 322 which determine whether the minimum accuracy has been achieved or an error has occurred.

If the answer to decision block 306 is no, control is transferred to decision block 308 which once again causes controller 101 to read detector 105 to verify that external reference signal 121 is present. If the latter signal is not present, control is transferred to block 307.

Decision block 309 verifies again that the temperature has been stable for a significant period of time. Decision block 311 determines whether the slip time obtained in block 304 is within a given range. If the slip time is either too high or too low this indicates that an error has occurred during the operation of slip detector 102. If error has occurred, control is transferred to block 307.

If no error has occurred, control is transferred from decision block 311 to block 312. Block 312 calculates change 204 of FIG. 2 and calculates the other compensation values for corrected data curve 202. Decision block 313 examines the new compensation values to determine if the new compensation values are reasonable. If the amount of change at any given temperature exceeds a predetermined amount, the compensation values are determined to be unreasonable and control is transferred to block 307. If the compensation values calculated in block 312 are reasonable, these compensation values along with a time stamp are stored in RAM 110 by controller 101 via microcomputer 113. The time stamp defines the day and time of day. Finally, control is transferred to block 301 to perform the recalibration procedure again.

Returning now to decision block 306, if the answer is yes, control is transferred to decision block 316. Decision blocks 316 and 317 perform the same operations as decision blocks 308 and 309. If the answers in both blocks 316 and 317 is yes, control is transferred to decision block 318. Decision block 318 determines, if the amount of time since the last iteration through blocks 301 through 314 is reasonable. If not, control is transferred to block 307. If the answer is yes, control is transferred to block 319 which makes sure that the compensation values in RAM 110 are reasonable with respect to the compensation values in EEPROM 112. If the answer to decision block 319 is yes, block 321 transfers the compensation values and time stamp stored in RAM 110 to EEPROM 112 and transfers control to block 322. Block 322 wait for a predefined amount of time and then starts the recalibration procedure again. Before transferring control to block 301, block 322 transfers the compensation values and time stamp stored in EEPROM 112 to RAM 110.

Figure 4:
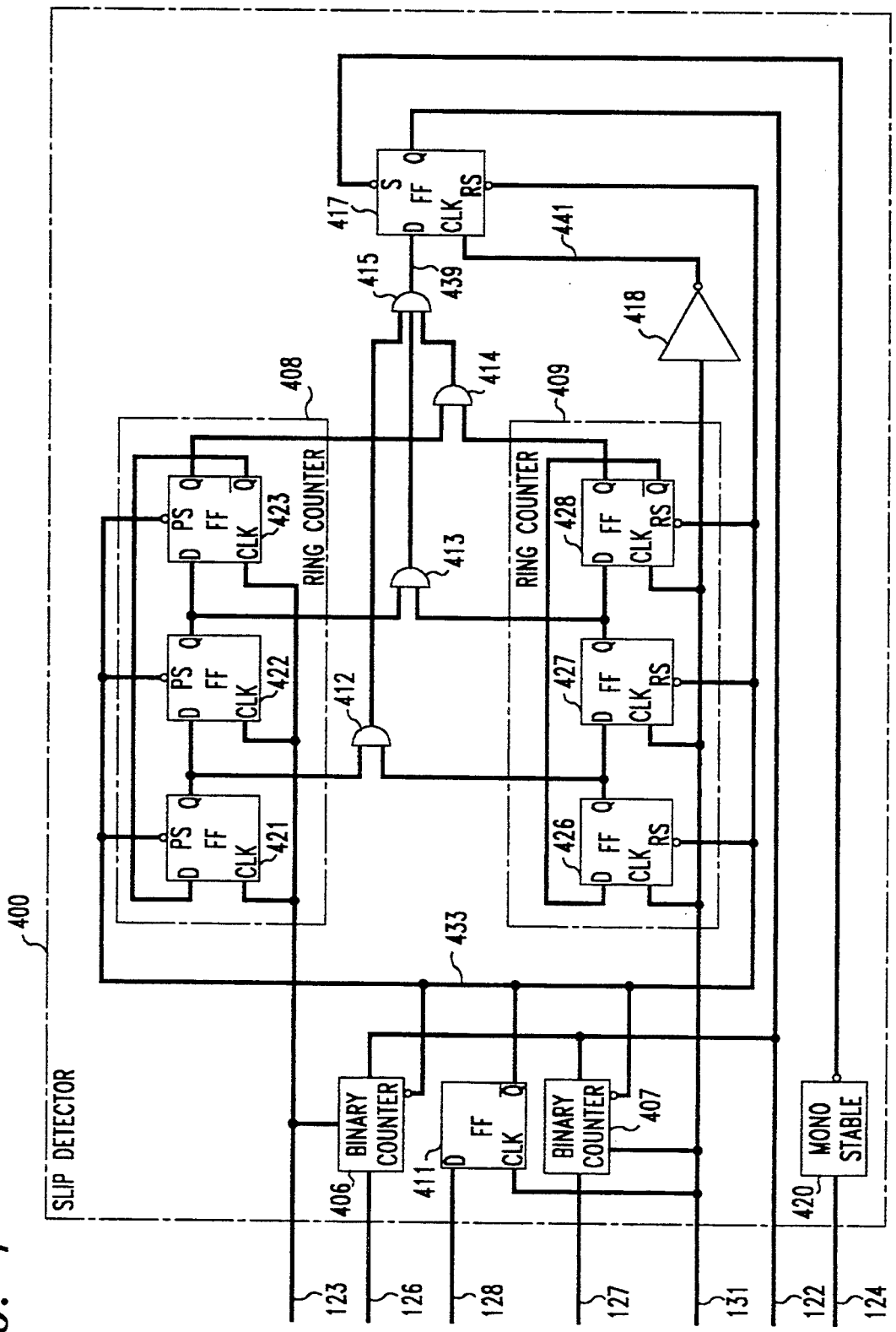
FIG. 4 illustrates the slip detector of FIG. 1 in block diagram form.

Slip detector 102 is illustrated in greater detail in FIG. 4. Ring counters 408 and 409, AND gates 412–415 and flip-flop 417 detect when the relative time interval error (RTIE) between DTCXO 104 and reference signal 121 has exceeded specified number of clock pulses of reference signal 121. Binary counters 406 and 407 are utilized to determine whether the frequency of DTCXO 104 is greater or less than reference signal 121.

Ring counters 408 and 409 are utilized to detect the RTIE between reference signal 121 and the output signal of divider 103 because only one flip-flop of a ring counter changes state for each clock signal. This avoids the problem of race conditions which would be caused by multiple flip-flops simultaneously changing states such as in a binary counter. Race conditions cause momentary 1's" and "O's" to appear on the inputs of AND gates 412–415. This is important, since ring counter 408 is clocked by the output signal from divider 103 and ring counter 409 is clocked by reference signal 121. These two clock signals are not correlated with each other, hence, potential race conditions would exist if the states of binary counters were compared by AND gates 412–415.

At the beginning of the synchronization process, controller 101 is transmitting a "1" to the D input of flip-flop 411 via conductor 128 as a result of the last recalibration operation. This "1" is continuously clocked into flip-flop 411 by reference signal 121 resulting in flip-flop 411 being set. When flip-flop 411 is set, a "0" is transmitted on conductor 433. This "0" resets binary counters 406 and 407, flip-flop 417, and ring counter 409 and sets ring counter 408. At this point in time, the state of ring counter 409 is "000", and the state of ring counter 408 is "111".

To start the synchronization process, controller 101 supplies a "0" on conductor 128 which resets flip-flop 411. In the reset state, flip-flop 411 transmits a "1" on conductor 433. The "1" on conductor 433 removes the reset input to ring counter 409, flip-flop 417, binary counter 407, and binary counter 406, and the set input to ring counter 408. With flip-flop 417 in the reset state, the clock enable inputs of binary counter 406 and binary counter 407 are enabled. All counters commence counting in response to their clock input signals.

Counters 406–409 count at a nominal frequency of 64 kHz. Binary counter 406 and ring counter 408 are clocked by the signal from divider 103 received via conductor 123, and binary counter 407 and ring counter 409 are clocked by reference signal 121 received via conductor 131. AND gates 412, 413, and 414 compare the stages of ring counters 408 and 409. An AND gate outputs a "1", if both of its corresponding stages in ring counters 408 and 409 are at a "1" state. After some period of time, if a frequency difference exists between DTCXO 104 and reference signal 121, ring counter 408 and ring counter 409 will be simultaneously in the "1" state in all stages together. When this occurs, AND gates 412–414 transmit 1s" to AND gate 415 which transmits a "1" via conductor 439 to flip-flop 417. The "1" on conductor 439 is synchronously clocked into flip-flop 417 and sets that flip-flop on the inverted state of reference signal 121 on conductor 131. In the set state, flip-flop 417 transmits a "1" on conductor 122. A "1" on conductor 122, inhibits the counting by binary counters 406 and 407 which saves their contents for later reading by controller 101. Since flip-flop 417 is clocked by inverter 418 inverting reference signal 121, ring counter 408 and ring counter 409 will be simultaneously in the "111" state after a difference of 2.5 clock pulses of reference signal 121 have occurred if the frequency of reference signal 121 is greater than DTCXO 104 and after a difference of 3.5 pulses of reference signal 121 have occurred if the frequency of reference signal 121 is less than DTCXO 104. Controller 101 uses the contents of binary counter 406 and binary counter 407 to determine the time interval to be used for calculating the adjustment for DTCXO 104.

Controller 101 is responsive to a "1" received from flip-flop 417 via conductor 122 to determine the time that has lapsed between the starting of the ring counters and the presence of a "1" on conductor 122. This time defines the difference in frequency between local DTCXO 104 and reference signal 121. Controller 101 determines an adjustment to be made to the frequency of DTCXO 104.

If reference signal 121 becomes unstable, this condition is detected by detector 105 which signals this fact to controller 101. In addition, the output of detector 105 causes monostable 420 to transmit a pulse to the set input of flip-flop 417 setting flip-flop 417. As previously described, controller 101 responds to the setting of flip-flop 417; however as is detailed in FIG. 3, controller 101 determines by reading detector 105 that an error has occurred.

We claim:

1. An apparatus for compensating an oscillator to correct frequency changes of an output signal of the oscillator due to aging of the oscillator with the oscillator having a first set of compensation values to correct the output signal for frequency changes due to temperature changes over a temperature range and the apparatus using an external reference signal, comprising:

means for detecting a difference in frequency between the output signal and the external reference signal;

means for determining the temperature of the oscillator;

means for storing the first set of compensation values with each compensation value corresponding to an individual temperature in the temperature range;

means for establishing that the temperature has been stable for a predefined amount of time;

means for establishing the stability of the external reference signal;

means for determining a new compensation value to correct the output signal to have the same frequency as the external reference signal at the determined temperature upon the temperature and external reference signal stable;

means for checking that the absolute difference between the new compensation value and the one of the first set of compensation values at the determined temperature is less than a predefined value; and means for generating a second set of compensation values upon the absolute difference being less than the predefined value by adding the difference between the new compensation value and the one of the first set of compensation values at the determined temperature to each of the first set of compensation values where the second set of compensation values corrects the oscillator throughout the operating temperature range of the oscillator for change due to aging.

2. The apparatus of claim 1 further comprising means for periodically initiating the generating of the second set of compensation values.

3. The apparatus of claim 2 wherein the oscillator is utilized in a telecommunication switching system and the external reference signal is derived from a telecommunication network to which the telecommunication switching system is interconnected.

4. The apparatus of claim 3 wherein the oscillator is in active use during the generating of the second set of compensation values.

5. A method for compensating an oscillator to correct frequency changes of an output signal of the oscillator due to aging of the oscillator with the oscillator having a first set of compensation values to correct the output signal for frequency changes due to temperature changes over a temperature range and the method using an external reference signal, the method comprising the steps of:

detecting a difference in frequency between the output signal and the external reference signal;

determining the temperature of the oscillator;

storing the first set of compensation values with each compensation value corresponding to an individual temperature in the temperature range;

establishing that the temperature has been stable for a predefined amount of time;

establishing the stability of the external reference signal;

determining a new compensation value to correct the output signal to have the same frequency as the external reference signal at the determined temperature upon the temperature and external reference signal being stable;

checking that the absolute difference between the new compensation value and the one of the first set of compensation values at the determined temperature is less than a predefined value; and generating a second set of compensation values upon the absolute difference being less than the predefined value by adding the difference between the new compensation value and the one of the first set of compensation values at the determined temperature to each of the first set of compensation values where the second set of compensation values correct the oscillator throughout the operating temperature range of the oscillator for changes due to aging.

6. The method of claim 5 further comprising the step of periodically initiating the generating of the second set of compensation values.

7. The method of claim 6 wherein the oscillator is utilized in a telecommunication switching system and the external reference signal is derived from a telecommunication network to which the telecommunication switching system is interconnected.

8. The method of claim 7 wherein the oscillator is in active use during the generating of the second set of compensation values.

* * * * *